United States Patent
Moravanszky

(10) Patent No.: US 8,860,766 B2
(45) Date of Patent: Oct. 14, 2014

(54) SYSTEM, METHOD, AND COMPUTER PROGRAM PRODUCT FOR DETERMINING ONE OR MORE CONTACT POINTS BETWEEN A PAIR OF OBJECTS

(75) Inventor: Adam Moravanszky, Zurich (CH)

(73) Assignee: NVIDIA Corporation, Santa Clara, CA (US)

( * ) Notice: Subject to any disclaimer, the term of this patent is extended or adjusted under 35 U.S.C. 154(b) by 761 days.

(21) Appl. No.: 12/895,782

(22) Filed: Sep. 30, 2010

(65) Prior Publication Data

US 2012/0084048 A1 Apr. 5, 2012

(51) Int. Cl.

| G09G 5/36 | (2006.01) |
|---|---|
| G05B 19/4069 | (2006.01) |
| G06T 17/00 | (2006.01) |
| G06T 17/10 | (2006.01) |
| G06T 19/00 | (2011.01) |
| G06T 13/20 | (2011.01) |
| G06F 17/50 | (2006.01) |

(52) U.S. Cl.
CPC ............ *G05B 19/4069* (2013.01); *G06T 17/00* (2013.01); *G06T 17/10* (2013.01); *G06T 2210/21* (2013.01); *G06T 19/00* (2013.01); *G06T 13/20* (2013.01); *G06F 17/50* (2013.01)
USPC ......................................................... 345/672

(58) Field of Classification Search
CPC ........................................................ G06T 17/10
USPC ......................................................... 345/672
See application file for complete search history.

(56) References Cited

U.S. PATENT DOCUMENTS

| 5,625,575 | A | * | 4/1997 | Goyal et al. ....................... 703/6 |
| 5,926,780 | A | * | 7/1999 | Fox et al. ...................... 702/142 |
| 6,044,306 | A | * | 3/2000 | Shapiro et al. .................. 700/90 |
| 7,092,862 | B2 | * | 8/2006 | Hooks ............................... 703/7 |
| 7,353,149 | B2 | * | 4/2008 | Strunk et al. ....................... 703/7 |
| 8,576,224 | B2 | * | 11/2013 | Vandenbrande et al. ..... 345/420 |
| 2006/0149516 | A1 | * | 7/2006 | Bond et al. ........................ 703/6 |
| 2006/0262114 | A1 | * | 11/2006 | Leprevost ...................... 345/419 |
| 2007/0016372 | A1 | * | 1/2007 | Browne et al. ................ 701/213 |
| 2007/0196801 | A1 | * | 8/2007 | Nagasaka et al. ............. 434/262 |
| 2009/0079734 | A1 | * | 3/2009 | McDaniel ..................... 345/419 |
| 2009/0267951 | A1 | * | 10/2009 | Chang et al. .................. 345/474 |
| 2010/0039446 | A1 | * | 2/2010 | Hillis et al. ................... 345/629 |
| 2010/0318904 | A1 | * | 12/2010 | Hillis et al. ................... 715/701 |

(Continued)

FOREIGN PATENT DOCUMENTS

EP 1255230 A2 11/2002

OTHER PUBLICATIONS

Collision Detection Algorithms for Motion Planning P. Jimenez F. Thomas C. Torras, Springer, ISBN 3-540-76219-1, 1998.*

(Continued)

*Primary Examiner* — Javid A Amini
(74) *Attorney, Agent, or Firm* — Zilka-Kotab, PC

(57) ABSTRACT

A system, method, and computer program product are provided for determining one or more contact points between a pair of objects. In operation, a first contact normal is identified between a pair of objects at a first position. Additionally, a relative velocity of the pair of objects is determined at the first position. Furthermore, one or more contact points between the pair of objects are determined at a second position through a translational analysis, utilizing the first contact normal and the relative velocity.

20 Claims, 6 Drawing Sheets

(56) References Cited

U.S. PATENT DOCUMENTS

| | | | |
|---|---|---|---|
| 2011/0077923 A1* | 3/2011 | Bond et al. ........................ | 703/2 |
| 2011/0189440 A1* | 8/2011 | Appleby et al. .............. | 428/156 |
| 2011/0246329 A1* | 10/2011 | Geisner et al. ............... | 705/27.1 |
| 2012/0206393 A1* | 8/2012 | Hillis et al. ................... | 345/173 |
| 2013/0082967 A1* | 4/2013 | Hillis et al. ................... | 345/173 |

OTHER PUBLICATIONS

Fast Contact Force Computation for Nonpenetrating Rigid Bodies; David Baraff; Computer Graphics Proceedings, Annual Conference Series, 1994.*

Ray Casting against General Convex Objects with Application to Continuous Collision Detection; Gino Van Den Bergen Playlogic Game Factory Breda, Netherlands gino@acm.org, Jun. 15, 2004.*

]Collision Detection in interactive 3D Computer Animation; Gino van den Bergen; 1999.*

Bridson R. et al., "Robust Treatment of Collisions, Contact and Friction for Cloth Animation," ACM, 2002, pp. 594-603.

Allard, J. et al., "Volume Contact Constraints at Arbitrary Resolution," ACM Transactions on Graphics, Jul. 2010, vol. 29, No. 4, Article 82, pp. 82:1-82:10.

Office Action from German Patent Application No. 10 2011 082 304.2, dated Nov. 28, 2012.

Redon, S. et al., Fast Continuous Collision Detection between Rigid Bodies, Eurographics 2002, 2002, vol. 21, No. 3, 2002, UK/USA (9 pages).

Mirtich, B. V., Impulse-based Dynamic Simulation of Rigid Body Systems, Thesis, UC Berkeley, 1996, California, pp. 1-246 (259 pages).

Van Den Bergen, G., Ray Casting against General Convex Objects with Application to Continuous Collision Detection, Jun. 15, 2004, pp. 1-17 (17 pages).

Examination Report from German Patent Application No. 10 2011 082 304.2, dated Jul. 31, 2014.

Bender, J. et al., "An impulse-based dynamic simulation system for VR applications," Proceedings of Virtual Concept 2005, Biarritz, France, Nov. 2005, pp. 101/1-101/9.

Bender, J. et al., "Constraint-based collision and contact handling using impulses," Proceedings of the 19th International Conference on Computer Animation and Social Agents. Geneva, Switzerland, 2006, pp. 1-9.

Guendelman, E. et al., "Non-convex Rigid Bodies with Stacking," ACM Transactions on Graphics 2003, vol. 22, pp. 871-878.

"3D Character Controller Implementation," DigitalRune Blog, Aug. 26, 2010, pp. 1-3.

* cited by examiner

SYSTEM, METHOD, AND COMPUTER PROGRAM PRODUCT FOR DETERMINING ONE OR MORE CONTACT POINTS BETWEEN A PAIR OF OBJECTS

FIELD OF THE INVENTION

The present invention relates to physics simulation, and more particularly to object collision detection.

BACKGROUND

It is highly desirable in the field of physics simulation to detect collisions between two or more objects in a displayed scenario in order to realistically portray the scenario to a user. For example, when two objects in a scenario collide, the detection of such collision may enable one or more actions to be performed in order to emulate a realistic reaction based on the collision.

However, current methods of performing collision detections have generally exhibited various limitations. For example, current graphics processing algorithms may miss collisions entirely, neglect a rotational motion of one or more of the objects, and/or be costly to execute (e.g., time-intensive, resource-intensive, etc.). There is thus a need for addressing these and/or other issues associated with the prior art.

SUMMARY

A system, method, and computer program product are provided for determining one or more contact points between a pair of objects. In operation, a first contact normal is identified between a pair of objects at a first position. Additionally, a relative velocity of the pair of objects is determined at the first position. Furthermore, one or more contact points between the pair of objects are determined at a second position through a translational analysis, utilizing the first contact normal and the relative velocity.

DETAILED DESCRIPTION

Figure 1:
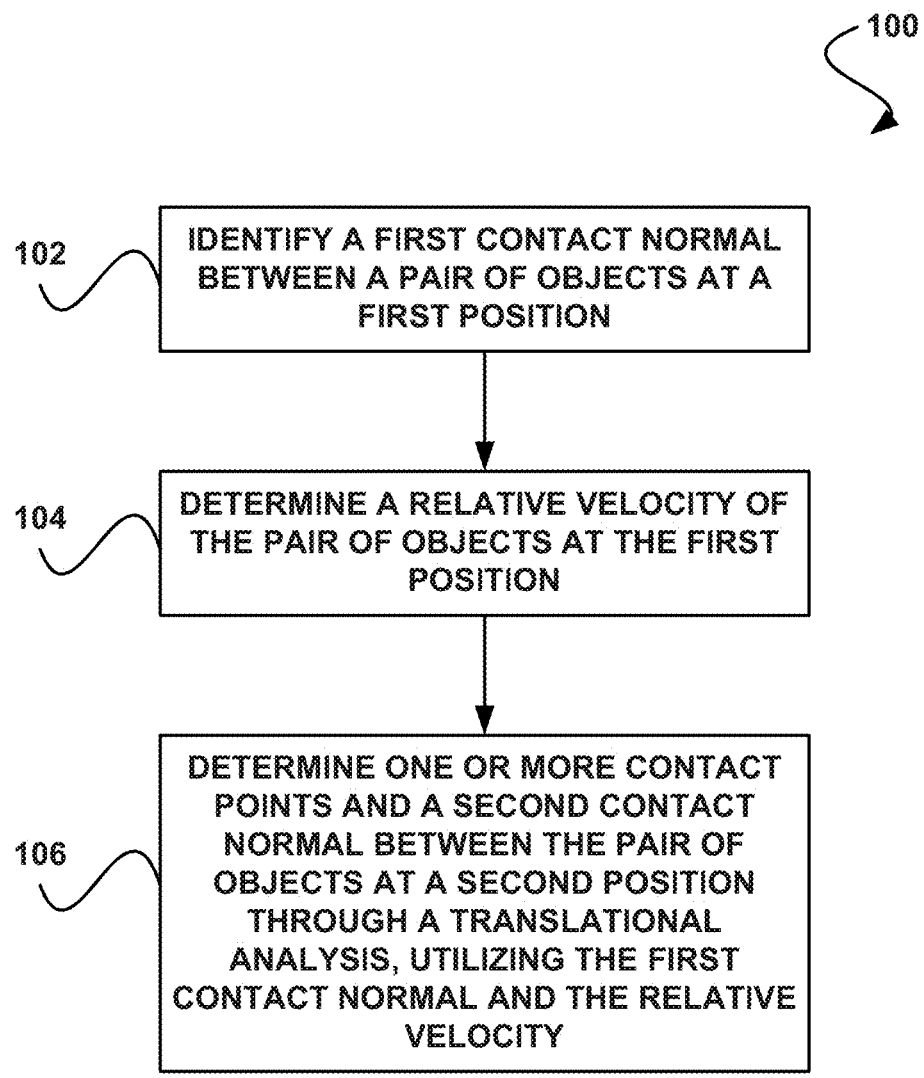
FIG. 1 shows a method for determining one or more contact points between a pair of objects, in accordance with one embodiment.

FIG. 1 shows a method 100 for determining one or more contact points between a pair of objects, in accordance with one embodiment. As shown, a first contact normal is identified between a pair of objects at a first position. See operation 102. In the context of the present description, the objects may include any objects capable of being analyzed utilizing a processor. In one embodiment, the objects may include elements of an event. For example, the objects may include elements of an interactive presentation, such as a video game. In another example, the objects may include elements of a simulation. For instance, the objects may include elements of a molecular dynamics simulation (e.g., a drugs research simulation, etc.). In another embodiment, the objects may include elements of an analysis. For example, the objects may include elements of an analysis for determining a compact packing of objects in a container, elements of an analysis for planning a motion of a robot arm servicing an assembly line, etc.

In yet another embodiment, one or both of the pair of objects may be moving. For example, one or both of the pair of objects may have an associated velocity vector. In another example, one or both of the pair of objects may be traveling in a rotational manner (e.g., spinning, etc.), a translational manner (e.g., a linear path, a parabolic path, etc.), or both.

Additionally, in one embodiment, the first position may indicate a location of the pair of objects at a particular time. For example, the first position may indicate a location of the pair of objects during a particular frame of an event involving multiple frames. In another embodiment, the objects may be touching at the first position. For example, the objects may have initially collided at the first position.

Further, in another embodiment, one or both of the pair of objects may be convex. In another embodiment, one or both of the pair of objects may be non-convex. For example, if one or both of the pair of objects is non-convex, such objects may be first decomposed into one or more convex objects. In yet another embodiment, the first contact normal may be associated with a direction in which the pair of objects interacts. For example, the first contact normal may represent a direction perpendicular to a surface of contact between the two objects. In still another embodiment, the first contact normal may be represented by a vector. For example, the first contact normal may be represented by a direction vector.

Further still, in one embodiment, the first contact normal may be identified at a particular time. For example, the first contact normal may be identified at a particular point in time of a simulation, display, interaction, etc. In another example, the first contact normal may be identified at a particular frame of an event involving multiple frames. Also, in one embodiment, the first contact normal may be provided by one or more algorithms. For example, the first contact normal may be provided by a continuous collision detection algorithm. In another example, the first contact normal may be provided by a discrete collision detection algorithm.

In another embodiment, the first contact normal may be identified as a result of monitoring the pair of objects. For example, a sweep of one or both of the objects may be performed by a continuous collision detection algorithm in the space in which the objects are traveling. In another example, the sweep may include a translational sweep, may account for rotational movement for one or both of the objects, etc. In another embodiment, the first contact normal may be identified as a result of a detected collision of the objects. For example, the continuous collision detection algorithm may detect a collision between the pair of objects as a result of the sweep and may identify the first contact normal in response to the detection. In another embodiment, the first contact normal may include a vector. For example, the first contact normal may include a contact normal vector.

Additionally, as shown in operation 104, a relative velocity of the pair of objects is determined at the first position. In one embodiment, the relative velocity may be calculated utilizing one or more formulas. For example, the relative velocity may be based on a determination of a velocity of each object as well as the direction that each object is traveling.

Further still, in one embodiment, the relative velocity of the pair of objects may be identified at a particular time. For example, the relative velocity of the pair of objects may be identified at the same time the first contact normal between the pair of objects is identified (e.g., when the pair of objects initially collide at the first position, etc.). Further, in another embodiment, the relative velocity of the pair of objects may be provided by one or more algorithms. For example, the relative velocity of the pair of objects may be provided by the continuous collision detection algorithm, the discrete collision detection algorithm, etc. In another embodiment, the relative velocity of the pair of objects may include one or more of a linear term and an angular term.

Also, as shown in operation 106, one or more contact points and a second contact normal between the pair of objects are determined at a second position through a translational analysis, utilizing the first contact normal and the relative velocity. In one embodiment, the second contact normal may include a contact normal at the one or more contact points. In another embodiment, the one or more contact points between the pair of objects may be determined for a time subsequent to the time that the first contact normal and the relative velocity are identified. For example, the first contact normal and the relative velocity may be identified during a particular frame of a sequence of displayed frames, and the one or more contact points between the pair of objects may be determined for a subsequent frame of the sequence (e.g., the next sequential frame, etc.).

In yet another embodiment, the one or more contact points between the pair of objects at the second position may include subsequent contact points that are determined after initial contact points have been determined at the first position during the initial contact between the pair of objects. In another embodiment, the second position may indicate a location where the pair of objects arrive after being moved forward from the first position along their respective trajectories as described by their linear and angular velocities over a predetermined period of time. Additionally, in one embodiment, the translational analysis may include a linear sweep operation that is performed utilizing the first contact normal and the relative velocity.

In another embodiment, the determining may include determining a temporary position for one or more of the pair of objects along the first contact normal at the first position. For example, the temporary position may be determined for one or both of the objects along the first contact normal at an arbitrary distance from the first position prior to performing the translational analysis. Additionally, the translational analysis may be performed from the temporary position. In this way, one or more collision detection operations may be avoided during the translational analysis.

Further, in one embodiment, the motion of the pair of objects (e.g., rotational motion, translational motion, etc.) may continue during the determining. For example, the one or more contact points between the pair of objects at the second position may be determined in a continuous manner without stopping the pair of objects at the one or more contact points. In this way, movement of the pair of objects may not be blocked during the determining. Additionally, by determining the one or more contact points between the pair of objects at the second position, the translational analysis may ensure that while the pair of objects are in contact, they do not pass through each other (e.g., such that a collision is not detected, etc.), even if one or both of the objects are in motion.

Also, in another embodiment, an additional contact normal and one or more additional contact points at a third position may be determined, utilizing the one or more contact points and the second contact normal at the second position. For example, a second relative velocity of the pair of objects may be determined at the second position, and an additional contact normal and one or more additional contact points between the pair of objects at the third position may be determined through a translational analysis, utilizing the second contact normal and the second relative velocity. In this way, additional contact points and contact normals may be iteratively determined (e.g., for each step of a simulation, etc.).

More illustrative information will now be set forth regarding various optional architectures and features with which the foregoing framework may or may not be implemented, per the desires of the user. It should be strongly noted that the following information is set forth for illustrative purposes and should not be construed as limiting in any manner. Any of the following features may be optionally incorporated with or without the exclusion of other features described.

Figure 2:
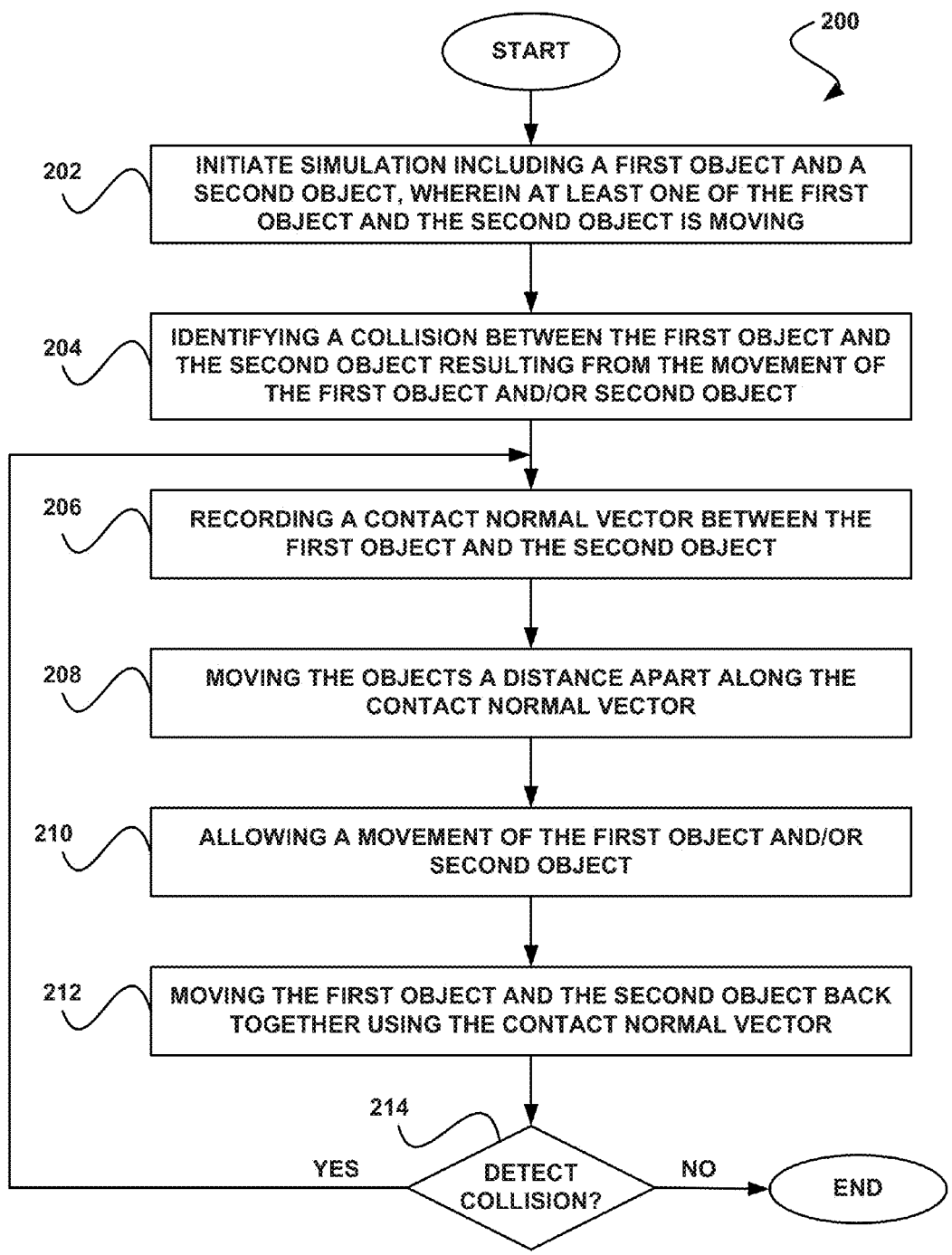
FIG. 2 shows a method for performing a translational analysis, in accordance with one embodiment.

FIG. 2 shows a method 200 for performing a translational analysis, in accordance with one embodiment. As an option, the present method 200 may be implemented in the context of the functionality and architecture of FIG. 1. Of course, however, the present method 200 may be implemented in any desired environment. It should also be noted that the aforementioned definitions may apply during the present description.

As shown in operation 202, a simulation including a first object and a second object is initiated, wherein at least one of the first object and the second object is moving. In one embodiment, the simulation may include a portion of an illustrated sequence, a portion of an interactive video game, etc. In another embodiment, the simulation may be displayed to a user (e.g., via a video display such as a monitor, etc.). In yet another embodiment, the simulation may not be displayed to the user (e.g., the simulation may include a nondisplayed analytical simulation, etc.).

Additionally, as shown in operation 204, a collision is detected between the first object and the second object resulting from the movement of the first object and/or the second object. In one embodiment, the collision may be detected as a result of monitoring the first object and/or the second object. For example, continuous collision detection may be performed on the simulation and may determine when a collision between the first object and the second object occurs.

Further, as shown in operation 206, a contact normal vector between the first object and the second object is recorded. In one embodiment, the contact normal vector between the first object and the second object may be provided as a result of monitoring the first object and/or the second object. For example, the contact normal vector between the first object and the second object may be provided by the continuous collision detection algorithm that detects the collision between the first object and the second object.

Additionally, as shown in operation 208, the first object and the second object are moved a distance apart along the contact normal vector. In one embodiment, the distance may be predetermined. In another embodiment, the distance may be arbitrary. For example, the first object and the second object may both be moved an arbitrary distance away from each other along the contact normal vector.

Further, as shown in operation 210, a movement of the first object and/or the second object is allowed. In one embodiment, the movement may include a translational and/or rotational movement of the first object and/or the second object prior to the collision between the first object and the second object. Further still, as shown in operation 212, the first object and the second object are moved back together using the contact normal vector. For example, the first object and the second object may be moved back together from their new positions after their movement along the contact normal vector recorded in operation 206.

In one embodiment, the first object and the second object may be moved back together utilizing a translational sweep operation. For example, a sweep operation may find a time of collision between the first object and the second object while the two objects are initially separated and undergoing translational motion along the contact normal vector. Additionally, if the time of the collision between the two objects is found before an entire motion opposite to that defined in operation 208 is carried out, then a contact normal and contact points are generated between the objects located along the sweep and touching at the time of collision, using one or more algorithms that can generate a contact normal and contact points for the two objects that are touching. Additionally, see, for example, "Ray Casting against General Convex Objects with Application to Continuous Collision Detection" (Gino Van Den Bergen, Jun. 15, 2004), which is hereby incorporated by reference in its entirety, and which describe examples of translations sweep operations.

Also, as shown in decision 214, it is determined whether another collision is identified between the first object and the second object. In one embodiment, the determination whether another collision is identified between the first object and the second object may be performed at the end of a predetermined interval. For example, the determination may be performed during each frame of the simulation. If in decision 214 it is determined that another collision is not identified between the first object and the second object, then no further action is taken. In this way, the first object and the second object may be considered to have separated.

However, if in decision 214 it is determined that another collision is identified between the first object and the second object, the method returns to operation 206. In this way, the first object and the second object may be considered to still be in contact, and translational analysis may continue to be performed during that contact.

Figure 3:
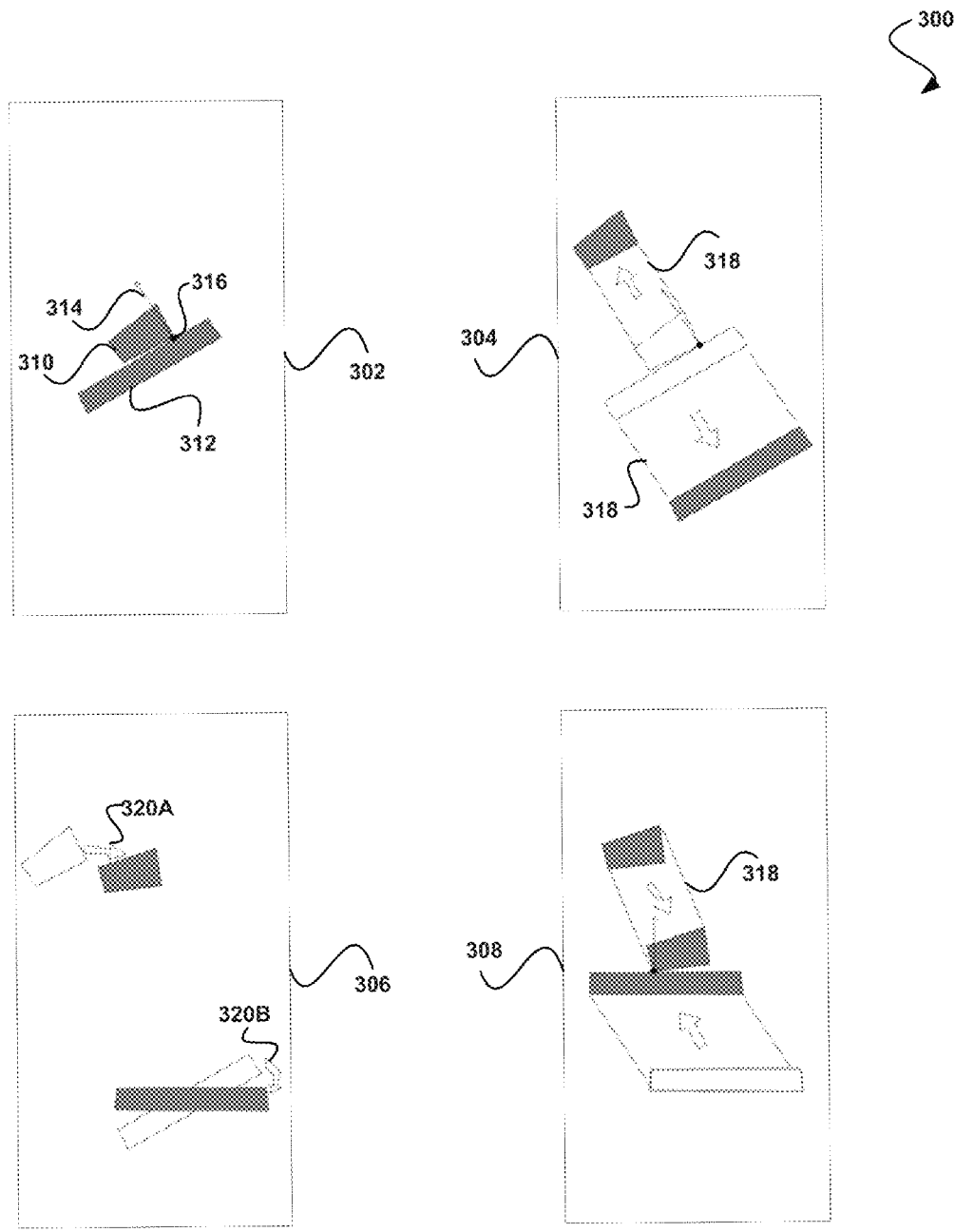
FIG. 3 shows a method of performing inexpensive approximate continuous collision detection for a pair of objects, in accordance with another embodiment.

FIG. 3 shows a method 300 of performing inexpensive approximate continuous collision detection for a pair of objects, in accordance with one embodiment. As an option, the present method 300 may be implemented in the context of the functionality and architecture of FIG. 1. Of course, however, the present method 300 may be implemented in any desired environment. It should also be noted that the aforementioned definitions may apply during the present description.

As shown in operation 302, a collision between a first object 310 and a second object 312 is detected during a simulation, and a contact normal 314 and contact points 316 are determined. In one embodiment, the collision may be detected using continuous collision detection. For example, it may be determined that the first object 310 and the second object 312 are not yet touching, but are moving with a certain velocity (e.g., angular and linear velocity, etc.) relative to each other. Additionally, full continuous collision detection may be performed over one or more discrete time intervals, to make sure that both the translational and rotational motions of the first object 310 and the second object 312 are checked for potential collision. Additionally, see, for example, "Fast Continuous Collision Detection between Rigid Bodies" (Stephane Redon et al., Proceedings Eurographics, 2002) and "Impulse-Based Dynamic Simulation of Rigid Body Systems" (Brian Mirtich, 1996), which are hereby incorporated by reference in its entirety, and which describe examples of continuous collision detection.

Figure 4:
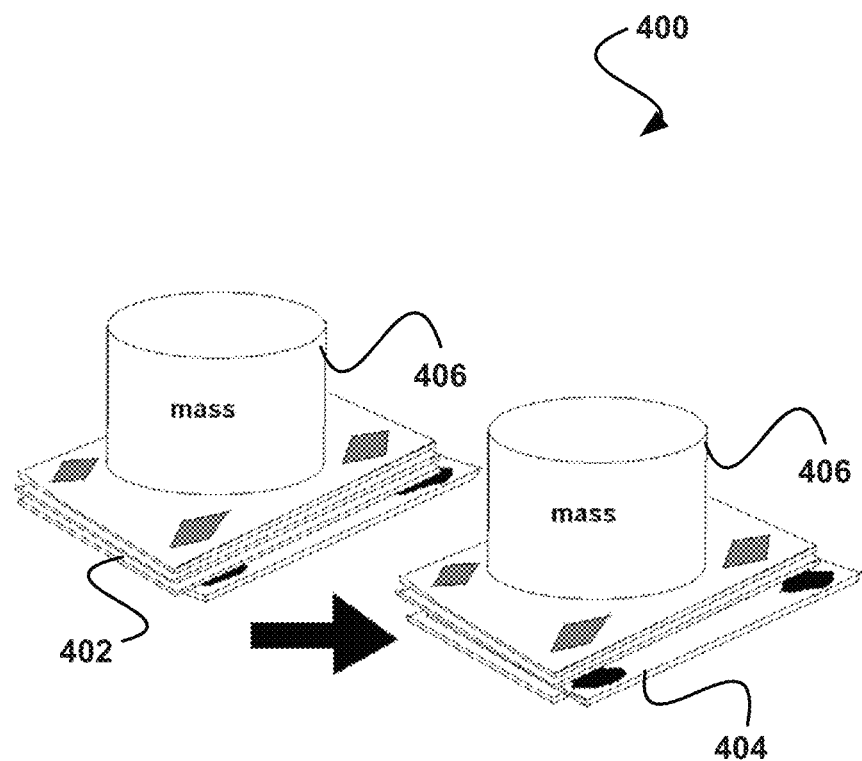
FIG. 4 shows a visual effect of tunneling, in accordance with one embodiment.

In another embodiment, when the first object 310 and the second object 312 are found to be colliding, a simulation time (e.g., the time of the simulation involving the first object 310 and the second object 312, etc.) may be rewound to the time of the collision, either for just this pair of objects, or the entire simulation. Additionally, the contact normal 314 between the first object 310 and the second object 312 may be recorded. In yet another embodiment, during one or more subsequent time steps (e.g., time steps in the simulation, etc.), the first object 310 and the second object 312 may be in contact with each other until they eventually separate again. As such, continuous testing may be performed even while the first object 310 and the second object 312 are in contact in order to prevent one or more of the objects from tunneling through each other. For example, FIG. 4 illustrates the visual effect 400 of tunneling, where playing cards 402 are located in a simulated deck of cards, and where the thin cards in the simulated deck of cards 402 tunnel through each other and become rearranged in the deck 404, due in part to a large pressure load 406 on the deck.

Therefore, it may be desirable to ensure that first object 310 and the second object 312 do not move out of contact if they move with an intersecting trajectory. Additionally, an accurate contact normal vector 314 and contact point 316 for the first object 310 and the second object 312 may also need to be generated for plausible simulation. In one embodiment, there may exist some flexibility in the precise positioning of the first object 310 and the second object 312 relative to each other, which may enable an avoidance of both the cost of full continuous collision detection, and may also enable the avoidance of collision detection occurring at arbitrarily high frequencies in time. This in turn may avoid frequent rewinding of already performed simulation, and may avoid slow implementation by stepping forward using small time steps.

Additionally, as shown in operation 304, the first object 310 and the second object 312 are moved a distance 318 apart along the contact normal vector 314. In one embodiment, the distance 318 may include a predetermined distance, an arbitrarily determined distance, etc. In one embodiment, collision detection may not be performed during the aforementioned moving, as the moving of the first object 310 and the second object 312 may always be possible without intersection. In this way, one or more collision detection computations may be avoided. In another embodiment, the first object 310 and the second object 312 may be considered completely independently (e.g., independently of other objects in the simulation, etc.).

Further, as shown in operation 306, the first object 310 and the second object 312 are allowed to perform their respective angular and linear motions 320A and 320B without interfering with each other. In this way, no collision detection computations may need to be performed during such motions. Further still, as shown in operation 308, the first object 310 and the second object 312 are moved back together along the same linear path 318 and contact normal 314 that was to move them apart. In one embodiment, the first object 310 and the second object 312 may collide, and continuous linear detection may be performed to catch any eventual collisions. In another embodiment, if a collision is determined, the result is recorded along with a new contact normal and contact points. If a collision is not detected, the objects may be considered to have separated.

In this way, a relative sliding motion of the first object 310 and the second object 312 in close proximity may be replaced with a hypothetical motion that may lead to similar overall results, but may be easier to compute. For example, expensive continuous collision detection during the relative sliding motion may be avoided. In another example, only the initial and final collisions may be calculated utilizing a translational analysis, and rotational analysis may therefore be avoided.

Additionally, one or more elements of motion associated with the first object 310 and the second object 312 may not be interfered with (e.g., blocked, etc.). For example, contacts 316 may be generated without interfering with the translational or rotational motion of the objects. In one embodiment, this may lessen the importance of the path taken by the first object 310 and/or the second object 312.

Figure 5:
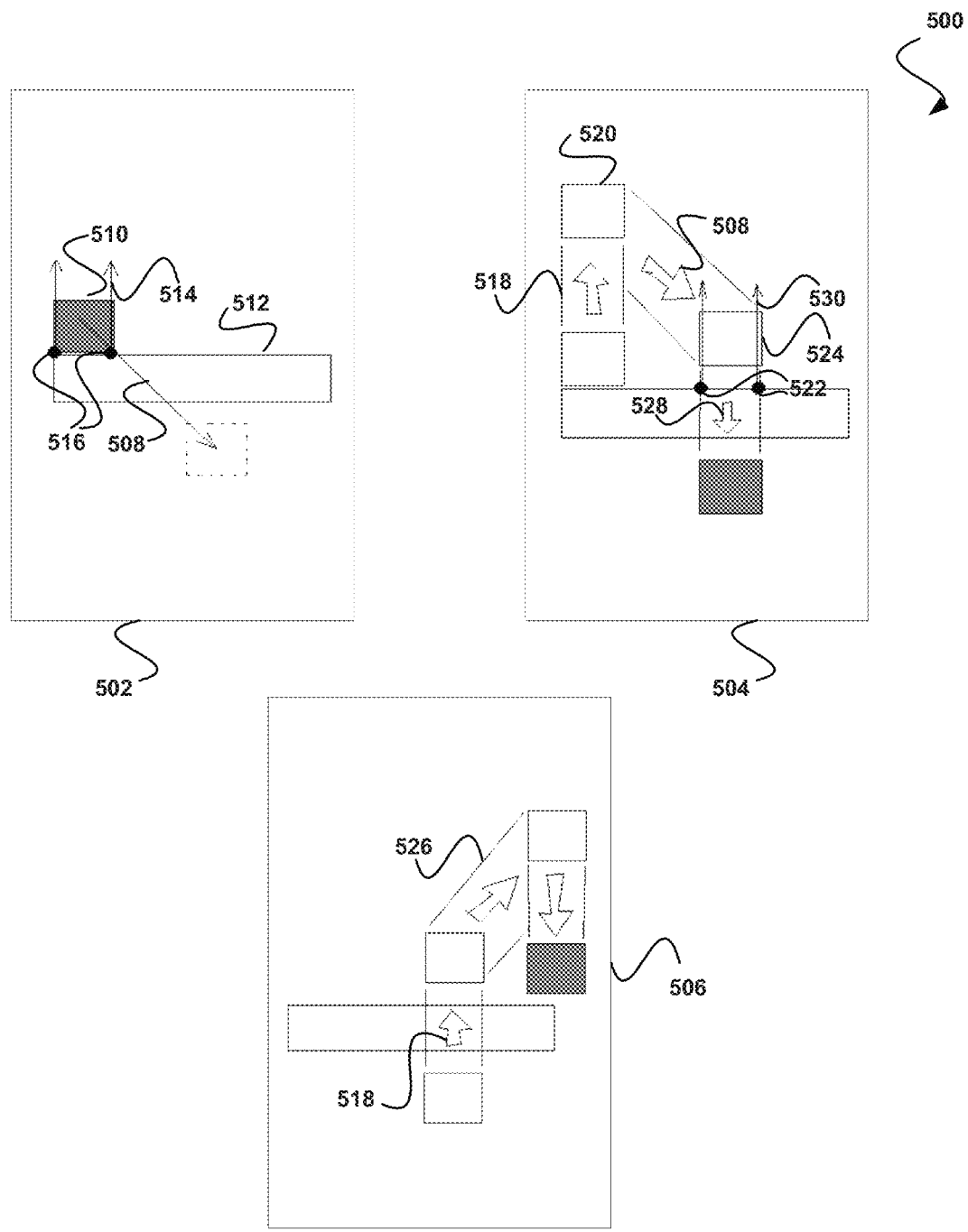
FIG. 5 shows a method of performing inexpensive approximate continuous collision detection for a pair of objects without rewinding, in accordance with another embodiment.

FIG. 5 shows a method 500 of performing inexpensive approximate continuous collision detection for a pair of objects without rewinding, in accordance with one embodiment. As an option, the present method 500 may be implemented in the context of the functionality and architecture of FIG. 1. Of course, however, the present method 500 may be implemented in any desired environment. It should also be noted that the aforementioned definitions may apply during the present description.

As shown in operation 502, a collision between a first object 510 having a velocity vector 508 and a second object 512 is detected during a simulation, and a contact normal 514 and contact points 516 are determined. Additionally, as shown in operation 504, a location 520 is determined at an arbitrary distance 518 along the determined contact normal 514. Further, the velocity vector 508 (indicated here as only a linear velocity for clarity, but may actually include angular motion as well) is then added to the location 520 in order to determine a new location 524. A sweep operation 528 is performed in the direction opposite to the contact normal 514 in order to get a time of impact, at which the contact points 522, and a respective new contact normal 530 are generated. Further still, a simulation time is not rewound to (or stopped at the) time of the collision.

Also, in a subsequent time step, as shown in operation 506, a new velocity 526 is calculated that separates the objects, and the first object 510 is again moved the arbitrary distance 518 along the determined contact normal 514, where the new velocity 526 is then applied. Additionally, the first object 510 is again moved back the arbitrary distance 518 along the determined contact normal 514, where it rests above the second object 512. In this way, although visual artifacts may be created when objects are rendered in an interpenetrating state, correct contact points may be generated, recovery from the intersection of the objects may be achieved in subsequent time steps, and the collision may be accurately detected and recorded.

In one embodiment, when the collision between the first object 510 and the second object 512 is detected during a simulation, the motion of the objects may be projected such that components of their relative motion that take place in the direction of the given contact normal at the first position is removed. In this way, the objects may be allowed to separate or move tangentially, but not further interpenetrate, thereby avoiding visual artifacts created when objects are rendered in an interpenetrating state.

Figure 6:
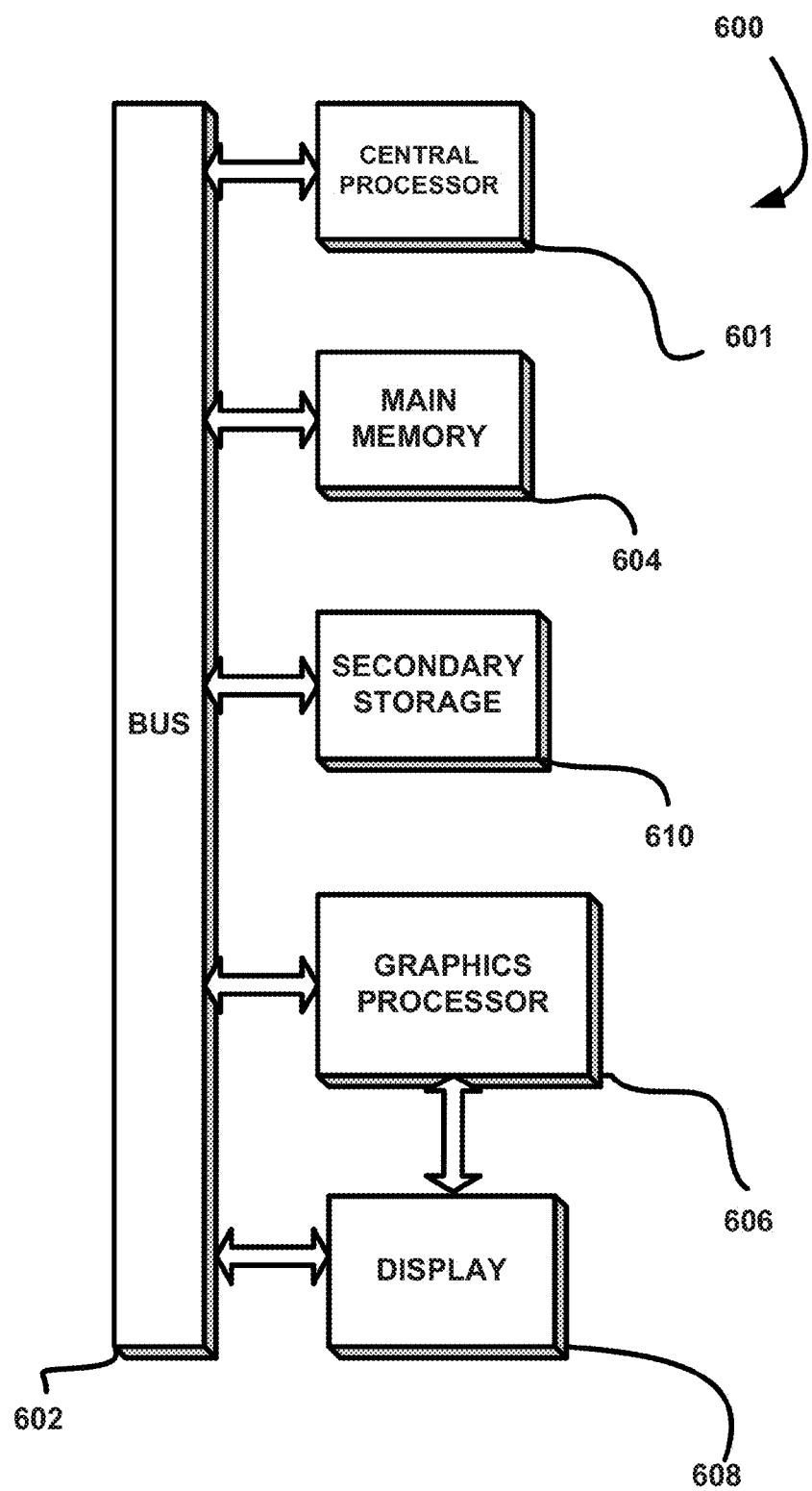
FIG. 6 illustrates an exemplary system in which the various architecture and/or functionality of the various previous embodiments may be implemented.

FIG. 6 illustrates an exemplary system 600 in which the various architecture and/or functionality of the various previous embodiments may be implemented. As shown, a system 600 is provided including at least one host processor 601 which is connected to a communication bus 602. The system 600 also includes a main memory 604. Control logic (software) and data are stored in the main memory 604 which may take the form of random access memory (RAM).

The system 600 also includes a graphics processor 606 and a display 608, i.e. a computer monitor. In one embodiment, the graphics processor 606 may include a plurality of shader modules, a rasterization module, etc. Each of the foregoing modules may even be situated on a single semiconductor platform to form a graphics processing unit (GPU).

In the present description, a single semiconductor platform may refer to a sole unitary semiconductor-based integrated circuit or chip. It should be noted that the term single semiconductor platform may also refer to multi-chip modules with increased connectivity which simulate on-chip operation, and make substantial improvements over utilizing a conventional central processing unit (CPU) and bus implementation. Of course, the various modules may also be situated separately or in various combinations of semiconductor platforms per the desires of the user.

The system 600 may also include a secondary storage 610. The secondary storage 610 includes, for example, a hard disk drive and/or a removable storage drive, representing a floppy disk drive, a magnetic tape drive, a compact disk drive, etc. The removable storage drive reads from and/or writes to a removable storage unit in a well known manner.

Computer programs, or computer control logic algorithms, may be stored in the main memory 604 and/or the secondary storage 610. Such computer programs, when executed, enable the system 600 to perform various functions. Memory 604, storage 610 and/or any other storage are possible examples of computer-readable media.

In one embodiment, the architecture and/or functionality of the various previous figures may be implemented in the context of the host processor 601, graphics processor 606, an integrated circuit (not shown) that is capable of at least a portion of the capabilities of both the host processor 601 and the graphics processor 606, a chipset (i.e. a group of integrated circuits designed to work and sold as a unit for performing related functions, etc.), and/or any other integrated circuit for that matter.

Still yet, the architecture and/or functionality of the various previous figures may be implemented in the context of a general computer system, a circuit board system, a game console system dedicated for entertainment purposes, an application-specific system, and/or any other desired system. For example, the system 600 may take the form of a desktop computer, lap-top computer, and/or any other type of logic. Still yet, the system 600 may take the form of various other devices including, but not limited to, a personal digital assistant (PDA) device, a mobile phone device, a television, etc.

Further, while not shown, the system 600 may be coupled to a network [e.g. a telecommunications network, local area network (LAN), wireless network, wide area network (WAN) such as the Internet, peer-to-peer network, cable network, etc.] for communication purposes.

While various embodiments have been described above, it should be understood that they have been presented by way of example only, and not limitation. Thus, the breadth and scope of a preferred embodiment should not be limited by any of the above-described exemplary embodiments, but should be defined only in accordance with the following claims and their equivalents.

What is claimed is:

1. A method, comprising:
   identifying, utilizing a processor, a first contact normal between a pair of objects at a first position during a simulation;
   moving the pair of objects from the first position a distance apart along a linear path of the first contact normal, wherein no collision detection is performed during the moving of the pair of objects the distance apart along the linear path of the first contact normal;

after moving the pair of objects the distance apart, allowing each of the objects in the pair of objects to perform respective angular and linear motions without interfering with the other object of the pair of objects, wherein no collision detection is performed during the performing of the respective angular and linear motions of the pair of objects; and after allowing the pair of objects to perform the respective angular and linear motions, moving the pair of objects back together along the linear path of the first contact normal used to move the pair of objects the distance apart, wherein collision detection is performed during the moving of the pair of objects back together for identifying whether there is a collision between the pair of objects;

wherein in response to identifying that there is a collision, determining one or more contact points and a second contact normal between the pair of objects at a second position.

2. The method of claim 1, wherein the objects include elements of the simulation.

3. The method of claim 1, wherein if one or both of the pair of objects is non-convex, such objects are first decomposed into one or more convex objects.

4. The method of claim 1, further comprising determining an additional contact normal and one or more additional contact points between the pair of objects at a third position through a translational analysis, utilizing the second contact normal and a second relative velocity.

5. The method of claim 1, wherein one or both of the pair of objects has an associated velocity vector.

6. The method of claim 1, wherein one or both of the pair of objects are traveling in a rotational manner.

7. The method of claim 1, wherein the objects are touching at the first position.

8. The method of claim 1, wherein the objects have initially collided at the first position.

9. The method of claim 1, wherein a sweep of both of the objects is performed by a continuous collision detection algorithm in a space in which the objects are traveling before a collision between the pair of objects to detect collision between the pair of objects and identify the first contact normal in response to the detection.

10. The method of claim 1, wherein the first contact normal is identified during a particular frame of a sequence of displayed frames, and the one or more contact points between the pair of objects is determined for a subsequent frame of the sequence.

11. The method of claim 1, wherein a linear sweep operation is performed utilizing the first contact normal.

12. The method of claim 11, wherein one or more initial contact points are calculated at the first position based on the first contact normal between the pair of objects, and these initial contact points are used to determine a direction of the linear sweep operation.

13. The method of claim 1, wherein motion of the pair of objects continues during the determining.

14. The method of claim 1, wherein, while the pair of objects are in contact, the objects do not pass through each other, even if one or both of the objects are in motion.

15. A computer program product embodied on a non-transitory computer readable medium, comprising:

code for identifying a first contact normal between a pair of objects at a first position during a simulation;

code for moving the pair of objects from the first position a distance apart along a linear path of the first contact normal, wherein no collision detection is performed during the moving of the pair of objects the distance apart along the linear path of the first contact normal;

code for, after moving the pair of objects the distance apart, allowing each of the objects in the pair of objects to perform respective angular and linear motions without interfering with the other object of the pair of objects, wherein no collision detection is performed during the performing of the respective angular and linear motions of the pair of objects; and code for, after allowing the pair of objects to perform the respective angular and linear motions, moving the pair of objects back together along the linear path of the first contact normal used to move the pair of objects the distance apart, wherein collision detection is performed during the moving of the pair of objects back together for identifying whether there is a collision between the pair of objects;

wherein in response to identifying that there is a collision, determining one or more contact points and a second contact normal between the pair of objects at a second position.

16. A system, comprising:
a processor for:
identifying a first contact normal between a pair of objects at a first position during a simulation, moving the pair of objects from the first position a distance apart along a linear path of the first contact normal, wherein no collision detection is performed during the moving of the pair of objects the distance apart along the linear path of the first contact normal, after moving the pair of objects the distance apart, allowing each of the objects in the pair of objects to perform respective angular and linear motions without interfering with the other object of the pair of objects, wherein no collision detection is performed during the performing of the respective angular and linear motions of the pair of objects, and after allowing the pair of objects to perform the respective angular and linear motions, moving the pair of objects back together along the linear path of the first contact normal used to move the pair of objects the distance apart, wherein collision detection is performed during the moving of the pair of objects back together for identifying whether there is a collision between the pair of objects, wherein in response to identifying that there is a collision, determining one or more contact points and a second contact normal between the pair of objects at a second position.

17. The system of claim 16, further comprising memory coupled to the processor via a bus.

18. The method of claim 12, wherein the one or more contact points between the pair of objects at the second position include subsequent contact points that are determined after the one or more initial contact points have been calculated at the first position during an initial contact between the pair of objects.

19. The method of claim 1, wherein the second position indicates a location where the pair of objects arrive after being moved forward from the first position along a respective trajectory for each of the objects as described by linear and angular velocities over a predetermined period of time.

20. The method of claim 1, wherein the pair of objects is moved back together along the linear path of the first contact normal from respective new positions after the pair of objects is allowed to perform the respective angular and linear motions.

* * * * *